(12) United States Patent
Shi et al.

(10) Patent No.: US 11,199,571 B2
(45) Date of Patent: *Dec. 14, 2021

(54) COAXIAL SOCKET OF IMPEDANCE MATCHING STRUCTURE FOR SEMICONDUCTOR CHIP TESTING AND MANUFACTURING METHOD THEREOF

(71) Applicant: Suzhou Taosheng Electronic Technology Co., Ltd., Suzhou (CN)

(72) Inventors: Yuanjun Shi, Suzhou (CN); Lanyong Yin, Shanghai (CN); Zongying Gao, Suzhou (CN); Kai Liu, Suzhou (CN); Zongmao Yang, Fuping (CN)

( * ) Notice: Subject to any disclaimer, the term of this patent is extended or adjusted under 35 U.S.C. 154(b) by 111 days.

This patent is subject to a terminal disclaimer.

(21) Appl. No.: 16/672,421

(22) Filed: Nov. 1, 2019

(65) Prior Publication Data

US 2021/0088574 A1    Mar. 25, 2021

(30) Foreign Application Priority Data

Sep. 25, 2019    (CN) .......................... 201910914677.9

(51) Int. Cl.
| | |
|---|---|
| G01R 1/067 | (2006.01) |
| G01R 31/26 | (2020.01) |
| G01R 1/04 | (2006.01) |

(52) U.S. Cl.
CPC ....... G01R 31/2601 (2013.01); G01R 1/0416 (2013.01); G01R 31/2607 (2013.01)

(58) Field of Classification Search
CPC .............. G01R 1/0416; G01R 1/0441; G01R 1/06722; G01R 31/2601; G01R 31/2607; G01R 31/2856

USPC ..................................................... 324/755.02
See application file for complete search history.

(56) References Cited

U.S. PATENT DOCUMENTS

| | | | | |
|---|---|---|---|---|
| 5,399,104 A | * | 3/1995 | Middlehurst | ........ H05K 7/1084 439/607.14 |
| 6,270,357 B1 | * | 8/2001 | Pfaff | ...................... G01R 1/045 439/71 |
| 2004/0212381 A1 | * | 10/2004 | Yoshida | ............. G01R 1/06722 324/755.02 |
| 2004/0212383 A1 | * | 10/2004 | Yanagisawa | ......... G01R 1/0441 324/754.08 |
| 2012/0108108 A1 | * | 5/2012 | Horikawa | ............ H01R 12/716 439/626 |
| 2020/0088763 A1 | * | 3/2020 | Zhou | ..................... G01R 1/0466 |
| 2021/0088578 A1 | * | 3/2021 | Shi | ..................... G01R 31/2856 |

* cited by examiner

Primary Examiner — Thang X Le
(74) Attorney, Agent, or Firm — W&KIP

(57) ABSTRACT

The present invention relates to a coaxial socket of an impedance matching structure for semiconductor chip testing and a manufacturing method thereof. The coaxial socket includes a test socket locating substrate, a test socket body, a test socket cover, and a test probe. A polymer I and a polymer II are installed and fastened in the test socket body and the test socket cover respectively. A probe slot I and a probe slot II are provided in the polymer I and the polymer II respectively. The test probe is inserted through the probe slot I and the probe slot II. In the present invention, the test socket body and the test socket cover are made of conductive metal, and single-end impedance matching of 50 ohms or differential impedance matching of 100 ohms is performed between them and the probe, to achieve superb signal transmission and heat conduction.

3 Claims, 3 Drawing Sheets

COAXIAL SOCKET OF IMPEDANCE MATCHING STRUCTURE FOR SEMICONDUCTOR CHIP TESTING AND MANUFACTURING METHOD THEREOF

CROSS-REFERENCE TO RELATED APPLICATIONS

This application claims priority to Chinese Patent Application No. 201910914677.9 with a filing date of Sep. 25, 2019. The content of the aforementioned application, including any intervening amendments thereto, are incorporated herein by reference.

TECHNICAL FIELD

The present invention relates to the field of chip test sockets, and in particular, to a coaxial socket of an impedance matching structure for semiconductor chip testing and a manufacturing method thereof.

BACKGROUND

With emergence of digital high-definition 4K, a communications frequency becomes increasingly high, and a carrier frequency of a chip also becomes increasingly high. Rate bandwidth of some serializers reaches 56 GHz or even higher. In addition, because of extensive popularization of the PAM4 technology, a requirement for an interference immunity of a serializer becomes increasingly high, and inter-channel isolation needs to reach −40 dB or lower. Due to relatively large inter-channel crosstalk, a traditional test socket gradually cannot satisfy existing chip performance testing. Therefore, a semiconductor chip test socket of an impedance matching structure has an increasingly vast prospect.

SUMMARY

The present invention is intended to provide a coaxial socket of an impedance matching structure for semiconductor chip testing and a manufacturing method thereof, to resolve a prior-art problem that a traditional test socket cannot satisfy existing chip performance testing.

According to an aspect of the present invention, a coaxial socket of an impedance matching structure for semiconductor chip testing is provided, including a test socket locating substrate, a test socket body, a test socket cover, and a test probe, where the test socket locating substrate, the test socket body, and the test socket cover are sequentially disposed from top to bottom, a polymer slot I and a polymer slot II are provided in the test socket body and the test socket cover respectively, a polymer b and a polymer II are installed and fastened in the polymer slot I and the polymer slot II, a probe slot I and a probe slot II are provided in the polymer I and the polymer II respectively, the test probe is inserted through the probe slot I and the probe slot II, and a material of the test socket body and the test socket cover is metal.

Further, both the test socket body and the test socket cover are installed on the test socket locating substrate by using fastening screws.

Further, a locking step I protruding toward a center is disposed in the middle of an inner wall of the polymer slot I, and a locking step II protruding inward is disposed at an outer end of an inner wall of the polymer slot II.

Further, a locking step III protruding, toward the center is disposed at an outer end of an inner wall of the probe slot I, and a locking step IV protruding toward the center is disposed at an outer end of an inner wall of the probe slot II.

According to another aspect of the present invention, a manufacturing method of a coaxial socket of an impedance matching structure for semiconductor chip testing is provided, including the following steps:

(1) processing signal holes and power holes on a test socket body and a test socket cover;

(2) separately stuffing polymers in the test socket body and the test socket cover;

(3) baking the test socket body and the test socket cover that are stuffed with the polymers, so that the polymers are solidified on the test socket body and the test socket cover;

(4) processing surfaces of the test socket body and the test socket cover on which the polymers are solidified;

(5) processing signal holes, power holes, and ground holes on the test socket body and the test socket cover;

(6) inserting a probe in the test socket body and closing the test socket cover; and (7) installing and fastening the test socket body and the test socket cover on a test socket locating substrate by using screws.

Specifically, step (2) is specifically as follows: in a vacuum environment, stuffing the polymers in the signal holes of the test socket body and the test socket cover through roll-in.

Specifically, step (3) is specifically as follows: placing the test socket body and the built-in test socket cover that are stuffed with the polymers in an oven, baking them at 120° C. for 30 min, baking them at 155° C. for 30 min, and baking them at 190° C. for 60 min.

Beneficial effects of the foregoing technical solutions of the present invention are as follows:

In the present invention, the test socket body and the test socket cover are made of conductive metal, and single-end impedance matching of 50 ohms or differential impedance matching of 100 ohms is performed between them and the probe, to achieve superb signal transmission and heat conduction. A ground barrier structure is used for the conductive metal test socket, to effectively shield inter-channel crosstalk and quickly transfer heat generated during testing. The test socket can achieve an insertion loss of −1 dB/40 GHz and a return loss of −10 dB/40 GHz, and inter-channel isolation exceeds −40 dB/20 GHz.

Figure 1:
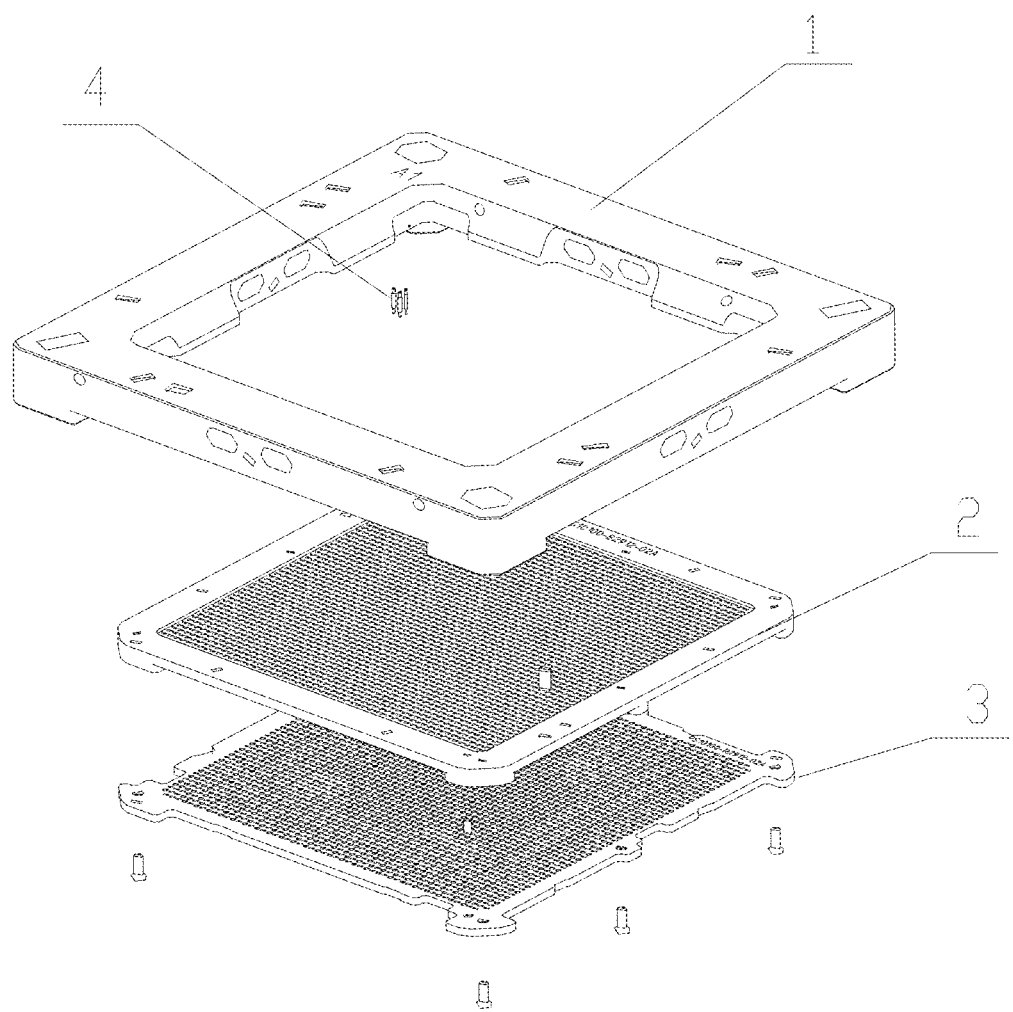
FIG. 1 is an exploded diagram of a coaxial socket for chip testing according to the present invention.

A list of parts represented by all reference signs in the drawings is as follows:

1—test socket locating substrate, 2—test socket body, 3—test socket cover, 4—test probe, 5—polymer I, 6—polymer II, 7—locking step I, 8—locking step II, 9—locking step III, 10—locking step IV

DESCRIPTION OF EMBODIMENTS

To make the objectives, technical solutions, and advantages of the embodiments of the present invention clearer, the following clearly and completely describes the technical solutions in the embodiments of the present invention with reference to the accompanying drawings in the embodiments of the present invention. Apparently, the described embodiments are some but not all of the embodiments of the present invention.

Figure 2:
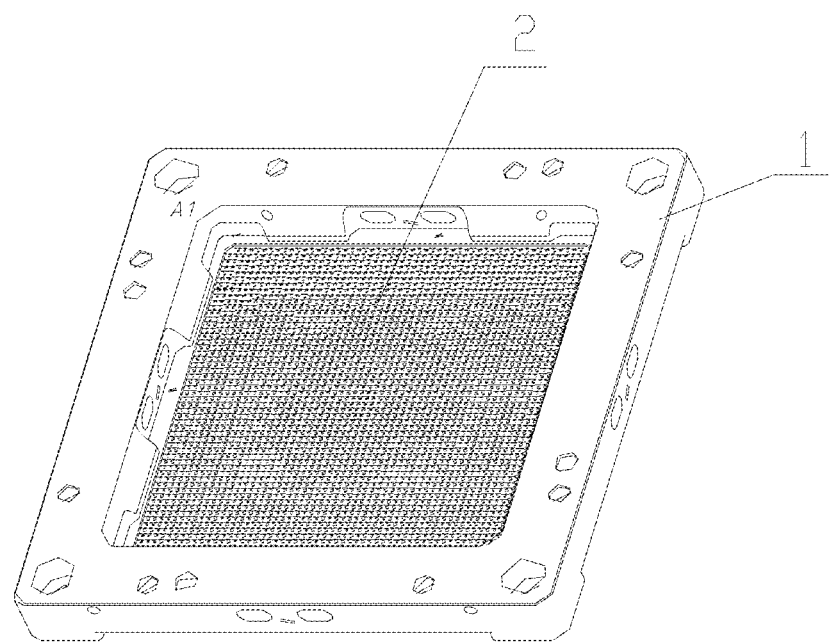
FIG. 2 is a schematic structural diagram of a coaxial socket for chip testing according to the present invention.
Figure 3:
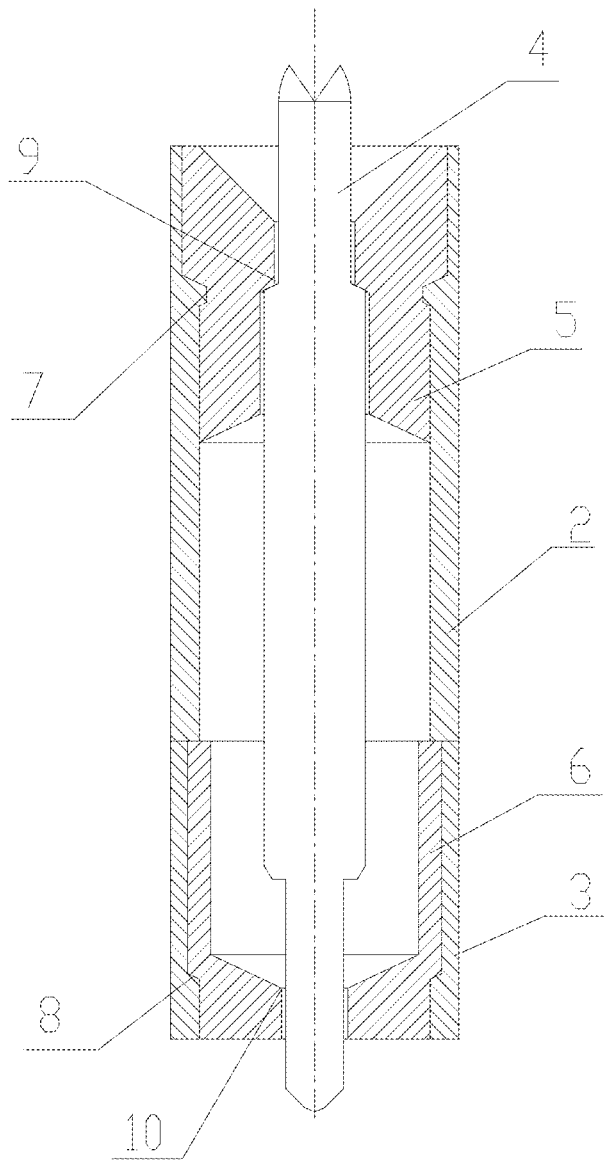
FIG. 3 is a cross section chart of a test probe and surrounding parts according to the present invention.

As shown in FIG. 1 to FIG. 3, a coaxial socket of an impedance matching structure for semiconductor chip testing in this embodiment includes a test socket locating substrate 1, a test socket body 2, a test socket cover 3, and a test probe 4. A chip slot is provided on the test socket locating substrate 1 to place and locate a chip. The test socket locating substrate 1, the test socket body 2, and the test socket cover 3 are sequentially disposed from top to bottom. A polymer slot I and a polymer slot II are provided in the test socket body 2 and the test socket cover 3 respectively. A polymer I 5 and a polymer II 6 are installed and fastened in the polymer slot I and the polymer slot II. A probe slot I and a probe slot II are provided in the polymer I 5 and the polymer II 6 respectively. The test probe 4 is inserted through the probe slot I and the probe slot II. A material of the test socket body 2 and the test socket cover 3 is metal. The test socket body 2 and the test socket cover 3 are installed on the test socket locating substrate 1 by using fastening screws.

A locking step I 7 protruding toward a center is disposed in the middle of an inner wall of the polymer slot I. A locking step II 8 protruding inward is disposed at an outer end of an inner wall of the polymer slot II. The locking step I 7 and the locking step II 8 fasten the polymer I 5 and the polymer II 6 respectively, to prevent them from falling off.

A locking step III 9 protruding toward the center is disposed at an outer end of an inner wall of the probe slot I. A locking step IV 10 protruding toward the center is disposed at an outer end of an inner wall of the probe slot II. The locking step III 9 and the locking step IV 10 are used to fasten the test probe 4, to prevent it from falling off.

A manufacturing method of the coaxial socket of an impedance matching structure for semiconductor chip testing includes the following steps:

(1) Process signal holes and power holes on the test socket body 2 and the test socket cover 3.

(2) In a vacuum environment, stuff the polymers in the signal holes of the test socket body 2 and the test socket cover 3 through roll-in.

(3) Place the test socket body 2 and the test socket cover 3 that are stuffed with the polymers in an oven, bake them at 120° C. for 30 min, bake them at 155° C. for 30 min, and bake them at 190° C. for 60 min, so that the polymers are solidified on the test socket body 2 and the test socket cover 3.

(4) Process surfaces of the test socket body 2 and the test socket cover 3 on which the polymers are solidified.

(5) Process signal holes, power holes, and ground holes on the test socket body 2 and the test socket cover 3.

(6) Insert the probe in the test socket body 2 and close the test socket cover 3.

(7) Install and fasten the test socket body 2 and the test socket cover 3 on the test socket locating substrate 1 by using screws.

To sum up, in the present invention, the test socket body and the test socket cover are made of conductive metal, and single-end impedance matching of 50 ohms or differential impedance matching of 100 ohms is performed between them and the probe, to achieve superb signal transmission and heat conduction. A ground barrier structure is used for the conductive metal test socket, to effectively shield inter-channel crosstalk and quickly transfer heat generated during testing. The test socket can achieve an insertion loss of −1 dB/40 GHz and a return loss of −10 dB/40 GHz, and inter-channel isolation exceeds −40 dB/20 GHz.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

We claim:

1. A manufacturing method of a coaxial socket of an impedance matching structure for semiconductor chip testing, comprising the following steps:
    (1) processing signal holes and power holes on a test socket body and a test socket cover;
    (2) separately stuffing polymers in the test socket body and the test socket cover;
    (3) baking the test socket body and the test socket cover that are stuffed with the polymers, so that the polymers are solidified on the test socket body and the test socket cover;
    (4) processing surfaces of the test socket body and the test socket cover on which the polymers are solidified;
    (5) inserting a probe in the test socket body and closing the test socket cover; and
    (6) installing and fastening the test socket body and the test socket cover on a test socket locating substrate by using screws.

2. The manufacturing method of a coaxial socket of an impedance matching structure for semiconductor chip testing according to claim 1, wherein step (2) is specifically as follows: in a vacuum environment, stuffing the polymers in the signal holes of the test socket body and the test socket cover through roll-in.

3. The manufacturing method of a coaxial socket of an impedance matching structure for semiconductor chip testing according to claim 1, wherein step (3) is specifically as follows: placing the test socket body and the built-in test socket cover that are stuffed with the polymers in an oven, baking them at 120° C. for 30 min, baking them at 155° C. for 30 min, and baking them at 190° C. for 60 min.

* * * * *